United States Patent [19]

Zachrai

[11] Patent Number: 5,333,950
[45] Date of Patent: Aug. 2, 1994

[54] CONTROL CABINET WITH RACK AND MOUNTING PLATE

[75] Inventor: Jürgen Zachrai, Dillenburg, Fed. Rep. of Germany

[73] Assignee: Rittal-Werk Rudolf Loh GmbH & Co. KG, Fed. Rep. of Germany

[21] Appl. No.: 984,947

[22] Filed: Dec. 4, 1992

[30] Foreign Application Priority Data

Dec. 5, 1991 [DE] Fed. Rep. of Germany ....... 4140072

[51] Int. Cl.$^5$ .............................................. A47B 57/00
[52] U.S. Cl. ................................ 312/265.1; 312/265.4; 52/280; 108/153; 108/180; 211/26; 211/182; 211/189
[58] Field of Search ............... 312/257.1, 265.1, 265.2, 312/265.3, 265.4, 263, ; 52/69, 280, 282.2, 653.1, 653.2; 108/153, 180; 211/26, 189, 191, 182

[56] References Cited

U.S. PATENT DOCUMENTS

| | | | |
|---|---|---|---|
| 2,574,410 | 11/1951 | O'Connor | 52/69 X |
| 3,034,844 | 5/1962 | Anderson et al. | 312/265.4 |
| 3,307,894 | 3/1967 | Collier | 312/257 |
| 3,378,320 | 4/1968 | Morgan et al. | 312/257.1 X |
| 3,901,571 | 8/1975 | Begitschke et al. | 312/263 X |
| 5,202,818 | 4/1993 | Betsch et al. | 312/265.1 X |
| 5,228,762 | 7/1993 | Mascrier | 312/265.4 |

FOREIGN PATENT DOCUMENTS

| | | |
|---|---|---|
| 7244638 | 12/1972 | Fed. Rep. of Germany . |
| 3423721 | 1/1986 | Fed. Rep. of Germany . |
| 8701711 | 5/1987 | Fed. Rep. of Germany . |
| 616921 | 2/1961 | Italy ....................................... 312/263 |
| 2095101 | 9/1982 | United Kingdom ............. 312/265.4 |

Primary Examiner—Kenneth J. Dorner
Assistant Examiner—David E. Allred
Attorney, Agent, or Firm—Speckman, Pauley & Fejer

[57] ABSTRACT

A control cabinet with a rack composed of a plurality of horizontal and vertical frame pieces, enclosed by a plurality of wall elements and a cabinet door, where a mounting plate, which has sliders with guide receptacles on their undersides, can be fastened parallel to a rear wall element. Each frame piece has two adjacent sides which are disposed perpendicularly to each other and have identical rows of fastening receivers. The two adjacent sides of each frame piece form an inner edge oriented towards an interior of the control cabinet. At least one of the horizontal frame pieces comprises a depth brace and a guide rail with a guide bar disposed parallel to the depth brace. In the course of inserting the mounting plate into the rack the guide receptacles of the sliders receive the guide bars of the guide rails and the sliders are displaceable on the guide bars. The expense for parts and assembly for guiding the mounting plate is reduced without impairing the fastening possibilities on the rack where the guide rails with their guide bars are formed as one piece with the depth braces, and where horizontal inner edges of the depth braces abut against the vertical inner edges of the vertical frame pieces at a vertical distance to the horizontal inner edges of the horizontal frame pieces.

14 Claims, 3 Drawing Sheets

CONTROL CABINET WITH RACK AND MOUNTING PLATE

BACKGROUND OF THE INVENTION

1. Field of the Invention

This invention relates to a control cabinet with a rack comprising frame pieces, which rack can be enclosed by wall elements and a cabinet door, where a mounting plate, having sliders with guide receptacles on its underside, can be fastened parallel to the rear wall, where all frame pieces have two sides disposed perpendicular to each other and have identical rows of fastening receivers, each said row constituting an inner edge, where guide rails having a guide bar are disposed parallel to the lower frame pieces in the form of depth braces, where in the course of inserting the mounting plate into the rack, the guide receptacles of the sliders receive the guide bars of the guide rails and where the sliders are displaceable on the guide bars.

2. Description of Prior Art

A control cabinet of this type is taught by German Utility Model DE-GM 84 18 270. The guide rails are embodied as separate components and are screwed together to the lower horizontal frame pieces. Not only does this require an additional expenditure of parts, but an additional assembly effort is required for installing the guide rails. Furthermore, the fastening places of the guide rails interfere with the installation of mounting rails or the like.

SUMMARY OF THE INVENTION

It is an object of this invention to provide a control cabinet of the type mentioned above where the parts and assembly fastening capabilities of the rack are not impaired.

This object is attained in accordance with one embodiment of this invention by a control cabinet having a rack in which the guide rails comprise a guide bar beveled as one piece to the lower depth braces, and the inner edges of the depth braces abut against the inner edges of the vertical frame pieces and have the same distance to the inner edges of the lower horizontal frame pieces.

In accordance with this embodiment, the lower depth braces also fulfill the function of the guide rails and are integrated into the rack without any additional fastening elements. The depth braces, because of the displacement of the inner edge of their two sides which form fastening receptacles, can also be employed in two directions for fastening of attachments without hindrance.

So that the mounting plate can be placed on the guide bars of the guide rails without hindrance by the frame pieces of the rack, in accordance with one embodiment of this invention, the ends of the guide bars of the depth braces are disposed in one plane with the inner edges of the lower horizontal frame pieces.

In accordance with a further embodiment of this invention, the guide bars form a row of fastening receptacles. In this way, additional parts can also be fastened on the guide bars.

Manufacture of the depth braces is simplified because the depth braces are embodied as multiple beveled stamped bent parts, where the guide bar and the vertically oriented side with the row of fastening receptacles form the end angles.

In accordance with one embodiment of this invention, the guide bar comprises two layers, where one end section is beveled on the guide bar, resulting in a stable guide bar with a rounded end edge, even with thin basic material for the depth braces.

In accordance with another embodiment, the depth braces comprise a vertical exterior section which forms a groove open toward the top and terminates flush with the facing outer sides of the vertical frame pieces. The depth braces also have a horizontal exterior section which terminates with the facing outer sides of the lower horizontal frame pieces to facilitate the attachment of wall elements.

In accordance with another embodiment of this invention, the stability of the depth braces is increased where the horizontal exterior section of the depth braces transforms into the guide bar through two transition sections, each being beveled at right angles.

In accordance with another embodiment, the sliders are equipped on the underside with plug receptacles, into which plug elements disposed on the rack can be inserted, thereby enabling fixing of the mounting plate in the area of its underside on the rack without additional screw connections. Screw connections are then limited to the area of its top.

Fixing of the underside of the mounting plate on the rack can also be achieved where the sliders are provided on the underside with plug projections which can be inserted in plug receptacles or fastening receptacles of the frame pieces.

So that the rows of fastening receptacles in the sides disposed perpendicular to each other and forming the inner edge of the depth braces are freely accessible, in accordance with one embodiment of this invention, the vertical sides of the depth braces with the row of fastening receptacles are arranged at a distance from the inner edge of the lower horizontal frame pieces in such a way that the rows of fastening receptacles are disposed completely above the lower horizontal frame piece and are flush with the fastening receptacles of the vertical frame pieces.

BRIEF DESCRIPTION OF THE DRAWINGS

This invention will be better understood from the following detailed description in conjunction with the drawings wherein.

DESCRIPTION OF PREFERRED EMBODIMENTS

Figure 1:
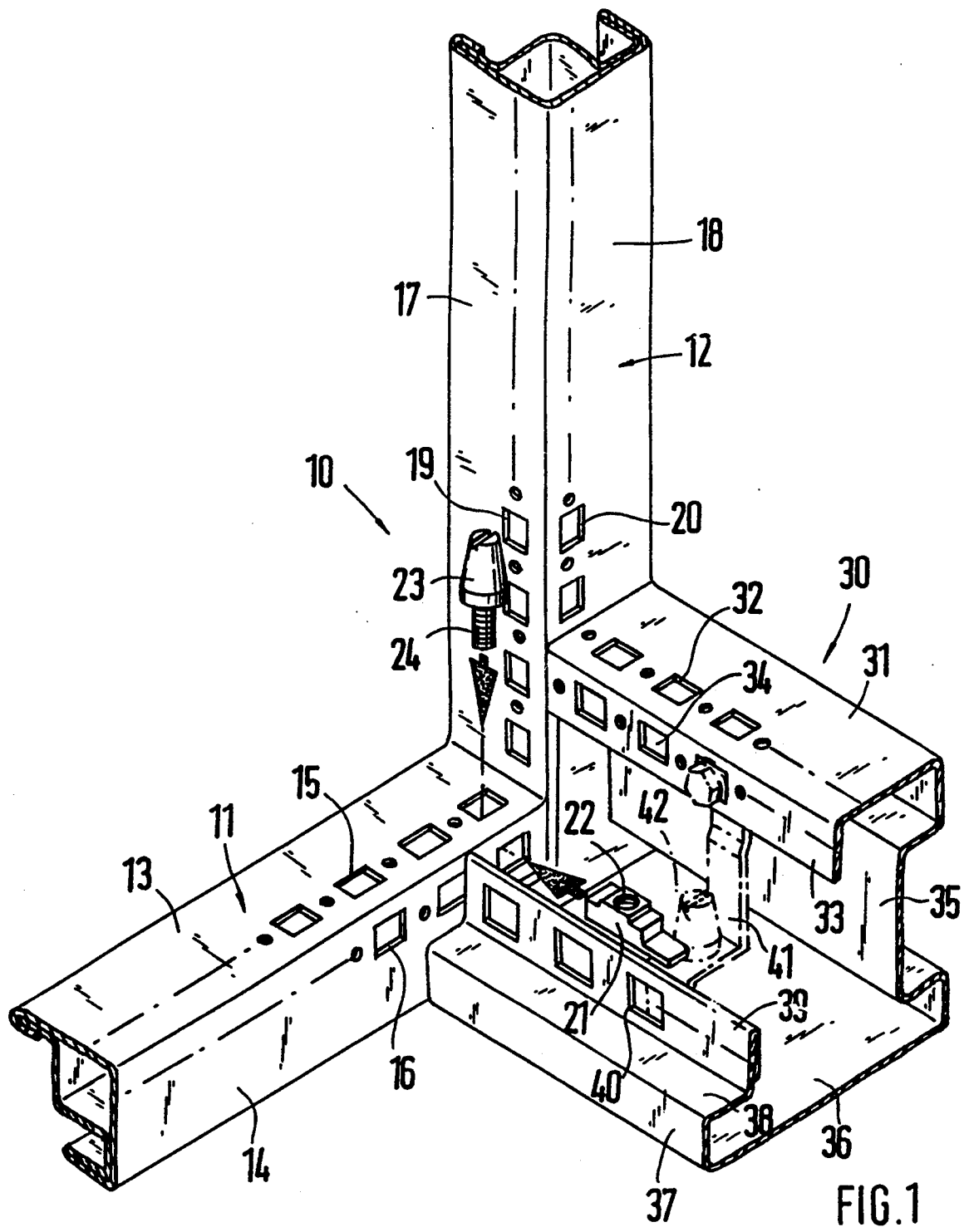
FIG. 1 is a perspective partial view of a rear lower corner of a rack in accordance with one embodiment of this invention.

As shown in FIG. 1, a rack 10 of a control box comprises horizontal frame pieces 11 and vertical frame pieces 12, which form frames on the front and back of the rack 10. These frames are connected to each other at the corners by depth braces 30. The upper depth braces, not shown, are made of the same hollow profiled section as the horizontal and vertical frame pieces 11 and 12. This uniform hollow profiled section has two sides 13 and 14 or 17 and 18, which are at right angles to each other, and which are provided with identical rows of fastening receptacles 15 and 16 or 19 and 20. These sides 13 and 14 or 17 and 18 form inner edges, each of which is oriented towards the interior of the cabinet. The lower depth braces 30 are embodied as stamped bent parts and are multiple beveled. The sides 31 and 33 are beveled as sections in such a way that they are perpendicular to each other. The sides 31 and 33 of the depth braces 30 also form an inner edge and are provided with a row of fastening receptacles 32 and 34, which are identical to the rows of fastening receptacles 15, 16, 19 and 20 in the sides of the frame pieces 11, 12 and which transform into a vertical outer section 35 having a groove formed in it at the center to facilitate attachment of the side wall. An inwardly oriented horizontal outer section 36 follows the vertical outer section 35. The inner edge of the horizontal outer section 36 is transformed through a vertical and a horizontal transition section 37 and 38 into a vertical guide bar 39, which is embodied in two layers by a beveled end sect i on. The free edge of the guide bar 39 is therefore broad and rounded, .so that it can act as a guide edge. The free edge of the guide bar 39 is located in the same plane as the sides 13 of the lower horizontal frame pieces 11, while the inner edges between the sides 31 and 33 of the depth braces 30 are at a predetermined distance in respect to the lower horizontal frame pieces 11. This distance selected such that the row of fastening receptacles 34 in the sides 33 of the depth braces 30 above the lower horizontal frame pieces 11 is easily accessible and is flush with the fastening receptacles 19 of the vertical frame pieces 12, as can be seen in FIG. 1.

Figure 2:
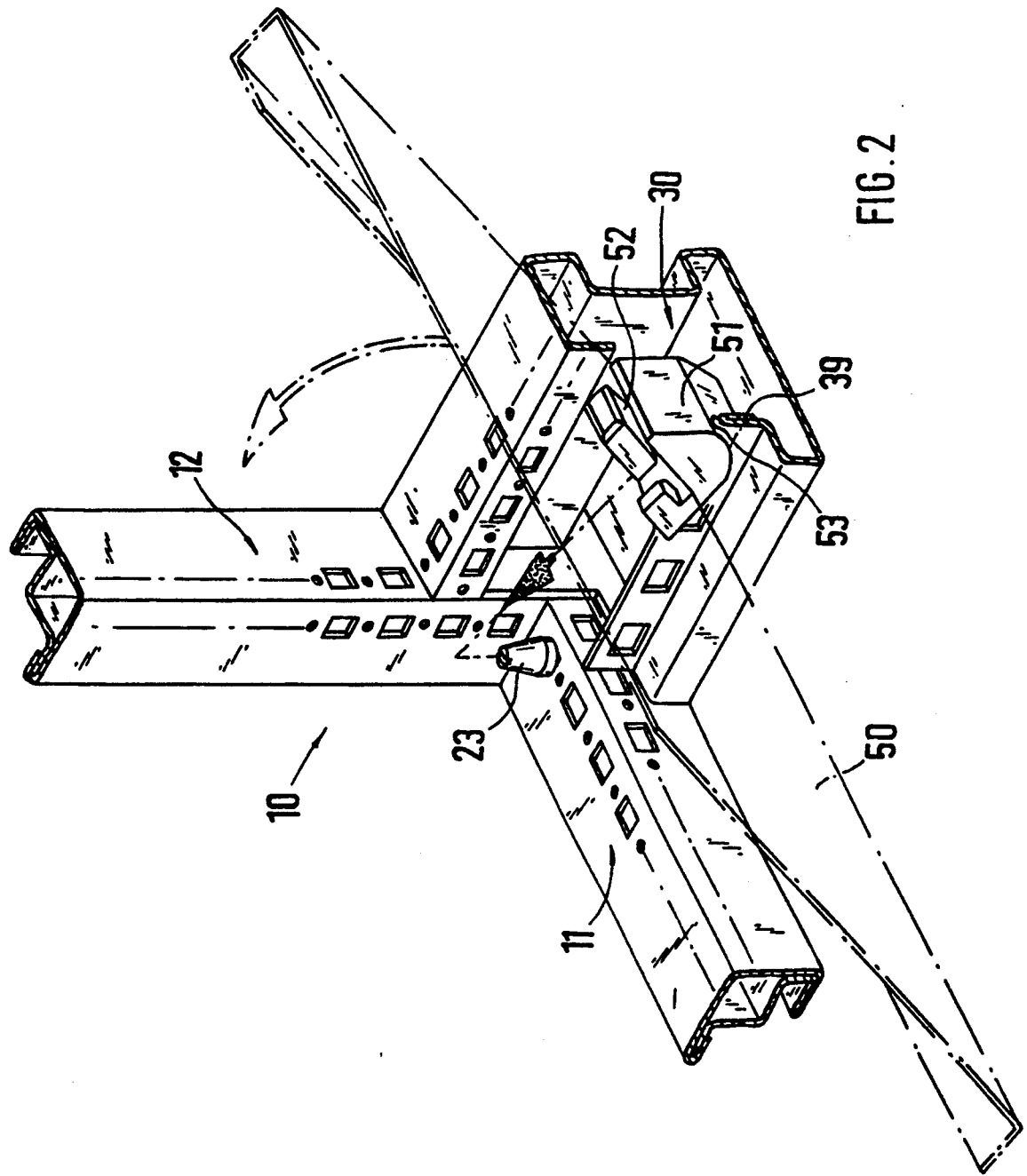
FIG. 2 is a perspective partial view of the corner of the rack shown in FIG. 1 with a mounting plate suggested in the insertion position.

As can be further seen in FIG. 1, a plug-in nut 21 with a threaded receptacle 22 is inserted into the last of fastening receptacles 16 of the vertical side 14 of the rear lower horizontal frame piece 11. A plug element 23 with a threaded bolt 24 is inserted through the last of fastening receptacles 15 in the horizontal side 13 of the rear lower horizontal frame piece 11 and screwed together with the plug-in nut 21 and fastened in this manner to the rack 10, as shown in FIG. 2. As the suggested angle 41 and the suggested plug element 42 indicate, the plug element for fixing the mounting plate 50 can also be fixed at a distance from the frame piece 11.

The guide bar 39 of the depth braces 30 is provided with a row of fastening receptacles 40 and can also be employed for the attachment of parts.

Sliders 51, preferably made of plastic, are fastened at the distance corresponding to the guide bars 39 of the two inner depth braces 30 on the underside of the mounting plate 50, which is reinforced by beveled edges 55 and 56. The sliders 51 form a receptacle 52, into which the mounting plate 50 is inserted. For this purpose, the edge of the mounting plate 50 is recessed at this place. The sliders 51 have a guide receptacle 53 on the underside, which receives the guide bar 39 of the depth braces 30, so that mounting plate 50, placed on the guide bars 39 in the area of the front of the rack 10, can be inserted in the direction towards the back of the rack 10, as suggested in FIG. 2.

Figure 3:
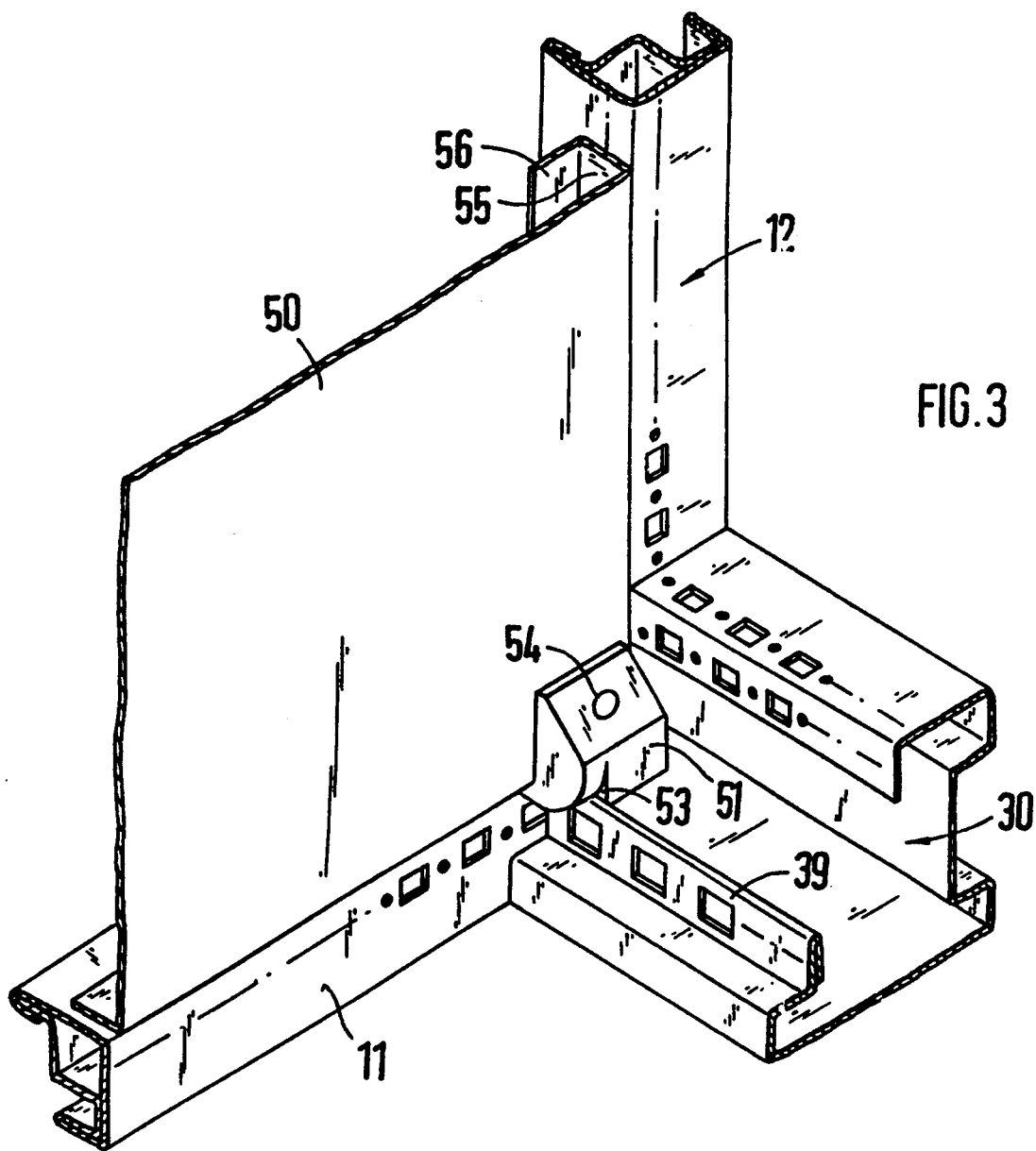
FIG. 3 is a perspective partial view of the corner of the rack shown in FIG. 1 with the mounting plate in the insertion position.

The underside of the sliders 51 also has a plug receptacle, not visible in FIGS. 2 and 3, into which the plug elements 23 can be inserted after the inserted mounting plate 50, which is initially in an oblique position, has reached its end position and is then perpendicularly straightened. In this way, the mounting plate 50 is automatically fixed with its underside on the rack 10, so that only the top of the mounting plate 50 need be screwed together to the rack 10 in order to assume the installation position in accordance with FIG. 3.

I claim:

1. In a control cabinet having a rack comprising a plurality of horizontal frame pieces and a plurality of vertical frame pieces enclosed by a plurality of wall elements and a cabinet door, a mounting plate having at least one slider with a guide receptacle on its underside, said mounting plate being fastenable parallel to a rear wall element of said control cabinet, each of said horizontal and vertical frame pieces having two adjacent sides disposed perpendicular to each other with identical rows of fastening receivers, said two adjacent sides of each of said horizontal and vertical frame pieces forming an inner edge oriented towards an interior of said control cabinet, at least one of said horizontal frame pieces comprising a depth brace, and a guide rail having a guide bar disposed parallel to said depth brace, in the course of inserting said mounting plate into said rack, said guide receptacle of said at least one slider receiving the guide bar of the guide rail and said at least one slider displacement on the guide bar, the improvement comprising:
said guide rail with said guide bar (39) formed as one piece with said depth brace (30),
said guide bar (39) comprising a guide bar free edge,
said inner edge of said depth brace being horizontal, an end thereof abutting against a vertical inner edge of one of said vertical frame pieces (12) at a vertical distance from the inner edge of one of said horizontal frame pieces (11), and
one of said sides (33) being vertical and depth brace adjacent having a depth brace free edge positioned at a distance from said guide bar free edge.

2. In a control cabinet in accordance wit claim 1, wherein
said guide bar free edge is coplanar with a horizontal adjacent side of said one of said horizontal frame pieces (11).

3. In a control cabinet in accordance with claim 1, wherein
said guide bar (39) forms a row of fastening receptacles (40).

4. In a control cabinet in accordance with claim 1, wherein
said depth brace (30) is formed as a multiple stamped bent part, whereby a plurality of depth brace transition sides connect the guide bar (39) to the vertical depth brace adjacent side (33) and said transition sides are disposed at a plurality of angles with respect to a longitudinal axis of said depth brace (30).

5. In a control cabinet in accordance with claim 4, wherein
said guide bar (39) comprises two layers, where an end side of the depth brace is doubled up on itself forming the guide bar (39).

6. In a control cabinet in accordance with claim 1, wherein
said depth brace (30) comprises a vertical exterior section (35) forming a groove open outwardly and having groove shoulders which are flush with a vertical outer side of said one of said vertical frame pieces (12), and
said depth brace (30) comprises a horizontal exterior side (36) which is flush with a horizontal outer side of said one of said horizontal frame pieces (11).

7. In a control cabinet in accordance with claim 6, wherein the horizontal exterior side (36) of said depth brace (30) is connected to said guide bar (39) by a vertical transition side (37) and a horizontal transition side (38), the vertical transition side (37) forming a right angle with the horizontal exterior side (36), and the horizontal transition side (38) forming a right angle with the vertical transition side (37).

8. In a control cabinet in accordance with claim 1, wherein said vertical distance from said depth brace horizontal inner edge to said horizontal inner edge of said one of said horizontal frame pieces (11) is predetermined, whereby a depth brace vertical adjacent side fastening receptacle row is disposed clear above said one of said horizontal frame pieces (11) and is aligned with at least one fastening receptacle (19) of a vertical adjacent side of said one of said vertical frame pieces (12).

9. In a control cabinet in accordance with claim 2, wherein said guide bar (39) forms a row of fastening receptacles (40).

10. In a control cabinet in accordance with claim 9, wherein said depth brace (30) is formed as a multiple stamped bent part, whereby a plurality of depth brace transition sides connect the guide bar (39) to the vertical depth brace against side (33) and said transition sides are disposed at a plurality of angles with respect to a longitudinal axis of said depth brace (30).

11. In a control cabinet in accordance with claim 10, wherein said guide bar (39) comprises two layers, where an end side of the depth brace is doubled up on itself forming the guide bar (39).

12. In a control cabinet in accordance with claim 1, wherein said depth brace (30) comprises a vertical exterior section (35) forming a groove open outwardly and having groove shoulders which are flush with a vertical outer side of said one of said vertical frame pieces (12), and said depth brace (30) comprises a horizontal exterior side (36) is flush with a horizontal outer side of said one of said horizontal frame pieces (11).

13. In a control cabinet in accordance with claim 6, wherein the horizontal exterior side (36) of said depth brace (30) is connected to said guide bar (39) by a vertical transition side (37) and a horizontal transition side (38), the vertical transition side (37) forming a right angle with the horizontal exterior side (36), and the horizontal transition side (38) forming a 14. In a control cabinet in accordance with claim 13, wherein said vertical distance form aid depth brace horizontal inner edge to said horizontal inner edge of said one of said horizontal frame pieces (11) is predetermined, whereby a depth brace vertical adjacent side fastening receptacle row is disposed clear above aid one of said horizontal frame pieces (11) and is aligned with at least one fastening receptacle (19) of a vertical adjacent side of said one of said vertical frame pieces (12).

* * * * *